(12) United States Patent
Honkura et al.

(10) Patent No.: US 8,698,503 B2
(45) Date of Patent: Apr. 15, 2014

(54) GEOMAGNETIC APPLICATION DEVICE

(75) Inventors: Yoshinobu Honkura, Aichi (JP); Katsuhiko Tsuchida, Aichi (JP); Eiji Kako, Aichi (JP); Ryuji Masaki, Aichi (JP)

(73) Assignee: Aichi Micro Intelligent Corporation, Tokai-shi (JP)

( * ) Notice: Subject to any disclaimer, the term of this patent is extended or adjusted under 35 U.S.C. 154(b) by 0 days.

(21) Appl. No.: 13/983,308

(22) PCT Filed: Jan. 30, 2012

(86) PCT No.: PCT/JP2012/051929
§ 371 (c)(1),
(2), (4) Date: Aug. 2, 2013

(87) PCT Pub. No.: WO2012/111413
PCT Pub. Date: Aug. 23, 2012

(65) Prior Publication Data
US 2013/0307547 A1 Nov. 21, 2013

(30) Foreign Application Priority Data
Feb. 17, 2011 (JP) .................................. 2011-031533

(51) Int. Cl.
*G01C 17/38* (2006.01)
(52) U.S. Cl.
USPC ........... 324/345; 324/244; 324/245; 324/301; 702/95; 702/141; 702/150; 33/355 R; 33/356; 701/538
(58) Field of Classification Search
USPC ................. 324/244, 245, 260, 261, 301, 345; 702/92, 95, 150, 141; 33/355 R, 354, 33/361, 356; 701/538
See application file for complete search history.

(56) References Cited

U.S. PATENT DOCUMENTS 7,278,219 B2 * 10/2007 Honkura et al. ................. 33/356
(Continued)

FOREIGN PATENT DOCUMENTS

| JP | 09 068431 | 3/1997 |
| JP | 2004 309227 | 11/2004 |

(Continued)

OTHER PUBLICATIONS

International Search Report Issued Apr. 24, 2012 in PCT/JP12/051929 Filed Jan. 30, 2012.

*Primary Examiner* — Huy Q Phan
*Assistant Examiner* — Adam Clarke
(74) *Attorney, Agent, or Firm* — Oblon, Spivak, McClelland, Maier & Neustadt, L.L.P.

(57) ABSTRACT

A geomagnetic application device including a triaxial magnetic sensor, a measurement point acquiring mechanism, a calibration mechanism calibrating offset of the magnetic sensor, and an azimuth calculator. The calibration mechanism includes an offset calculation measurement point selector selecting at least six measurement points of the geomagnetic vectors from among a data set stored in the measurement point storage unit by the measurement point acquiring mechanism and storing the selected measurement points in an offset calculation measurement point storage unit. The offset calculation measurement point selector selects the measurement points from among the data set stored in the measurement point storage unit to include at least six points, component values of which are maximum or minimum in each of three orthogonal axes.

8 Claims, 8 Drawing Sheets

(56) References Cited

U.S. PATENT DOCUMENTS

| | | | | |
|---|---|---|---|---|
| 2008/0289203 | A1* | 11/2008 | Martikka et al. | 33/356 |
| 2009/0292496 | A1* | 11/2009 | Schierbeek et al. | 702/92 |
| 2010/0312509 | A1* | 12/2010 | Patel et al. | 702/92 |
| 2011/0087451 | A1* | 4/2011 | Wright et al. | 702/92 |
| 2012/0072114 | A1* | 3/2012 | Sato et al. | 701/538 |

FOREIGN PATENT DOCUMENTS

| | | |
|---|---|---|
| JP | 2005 195376 | 7/2005 |
| JP | 2006 047038 | 2/2006 |
| JP | 2007 271454 | 10/2007 |
| JP | 2008 241675 | 10/2008 |

* cited by examiner

GEOMAGNETIC APPLICATION DEVICE

TECHNICAL FIELD

The present invention relates to a geomagnetic application device that measures earth magnetism using a magnetic sensor and utilizes the measured value, and relates to a mobile device having any function such as an electronic compass, an air mouse, a magnetic gyroscope, and AR (also mentioned as augmented reality). More particularly, the invention relates to a geomagnetic application device that can correctly measure, by performing adequate calibration, an azimuth which the geomagnetic application device faces, even in a case where an azimuth sphere including measurement points obtained with a triaxial magnetic sensor is an ellipsoidal sphere rather than a true sphere for the reason that, for example, sensitivities of the triaxial magnetic sensor are different each other.

BACKGROUND ART

Various geomagnetic application devices have been used that measure a geomagnetic vector and utilize results of the measurement, such as an electronic compass which includes a magnetic sensor for detecting earth magnetism and performs azimuth measurement based on a geomagnetic vector detected with the magnetic sensor and an air mouse which enables operations on a computer screen by changing its own direction in the air. In this case, the electronic compass can calculate its own azimuth based on the data of a geomagnetic vector obtained from the magnetic sensor and use it when deciding a user's traveling direction in navigation for guiding him to his destination on the screen of a cellular phone, etc. The air mouse having a built-in magnetic sensor is rotated in the air to calculate its own direction from the earth magnetism detected during the rotation, and enables an operation on computer screen based on the calculated direction. Further, a magnetic gyroscope can calculate a rotation axis based on detected results of earth magnetism to obtain its own rotation angle and angular speed, therefore, it is very important in this case also to accurately calculate an azimuth, etc. from the detected earth magnetism. As stated above, detection of earth magnetism can be applied for various purposes, the geomagnetic vector is required to be accurately measured for such occasions.

The geomagnetic application devices mainly include mobile devices such as a cellular phone, a portable game machine, and a tablet PC for portable use. Because such a geomagnetic application device incorporates a magnetized electronic component such as a speaker, the magnetic sensor built in the device consequently detect a magnetic field as combined one consisting of earth magnetism and a magnetic field generated by such an electronic component. Therefore, calibration processing is required to correct an error (offset) caused by the magnetic field generated by the built-in electronic component of the geomagnetic application device.

Accordingly, in the past, an offset value was estimated by utilizing postural change of the geomagnetic application device, which was resulted from users' operation of the device for some purpose. And in some cases, the geomagnetic application device was forced to rotate by the user in a specific manner so as to cause postural change of the device and to be measured with the magnetic sensor. Then, an offset value was estimated on the basis of measured data on a magnetic sensor, which had been collected in various postures of the device.

Specifically, if output components of a triaxial magnetic sensor during rotating under constant earth magnetism are respectively plotted in a space, the resultant trajectory forms a sphere. The sphere is referred to as an azimuth sphere, a center point of which corresponds to an offset of the magnetic sensor. Therefore, calibrating the offset is none other than employing the center point of the azimuth sphere obtained based on the earth magnetism measured in the various azimuths and postures as a new offset value. The radius of the azimuth sphere corresponds to the intensity of earth magnetism.

To accurately obtain coordinates of the center point of the azimuth sphere, it is necessary to obtain data of measurement points on the azimuth sphere in an area as wide as possible by operation for turning the geomagnetic application device in every direction evenly.

However, such operations impose excessive burdens on the user. To eliminate the burdens, a technique has been proposed that utilizes a change in posture of the geomagnetic application device, which was resulted from users' operation which the user thinks necessary without purposely requesting the user to conduct a specific operation for turning the device so that the data which satisfies certain conditions adequate to accurately determine the azimuth sphere are selected among the obtained measurement points to obtain the center point of the azimuth sphere (Patent Document 1).

RELATED ART DOCUMENT

Patent Documents

Patent Document 1: JP-A 2008-241675
Patent Document 2: JP-A H9-68431

SUMMARY OF THE INVENTION

Problem to be Solved by the Invention

Patent Document 1 described above is premised on the assumption that the triaxial magnetic sensor built in a geomagnetic application device has the same sensitivity in three axes respectively and provides the same output voltage for geomagnetic vector having the same magnitude. On such premise, the azimuth sphere is a true sphere having a constant radius irrespective of the azimuth.

However, as described above, the geomagnetic application device incorporates magnetized electronic components. In particular, some of the magnetized electronic components have soft magnetic properties which are apt to collect magnetic lines. If the geomagnetic sensor is disposed near such a component, there is a possibility that the geomagnetic sensor may be strongly affected from magnetism of the component in a certain azimuth. Further, in some cases, irregularities during manufacturing may cause a difference in sensitivity among the three axes in the triaxial magnetic sensor. In such a case, the azimuth sphere becomes an ellipsoidal sphere rather than a true sphere, so that an accurate offset correction is made impossible because the offset value is obtained on the premise of a true sphere. That is, it is necessary to examine a method for selecting a measurement point suitable for obtaining an offset value in a case where the azimuth sphere becomes an ellipsoidal sphere.

A patent application already has been filed (for example, Patent Document 2 described above), which has an object to obtain an offset value in a case where the azimuth sphere or the azimuth circle becomes ellipsoidal. However, in the past patent applications including Patent Document 2, which were filed hitherto and intended to calculate offset values in consideration of an ellipsoidal sphere, there can be found only the description that obtained measurement points are allowed to be used in offset calculation without selection. Among others, in a case where a measured value to be detected are not of two axes as in the case of Patent Document 2 but of three axes, calculation of a center point requires to obtain the measured points in various directions as compared to the case of two axes. Thus, data obtained only by simple rotation in single plane (such as rotation of a ship etc.) cannot make precise offset value calculation possible. Further, as mentioned above, in a case where measurement points are required in various directions in such a three-dimensional space, even if the user rotates the geomagnetic application device in a manner to trace out a figure-of-8, the measurement points required to obtain an offset value are not necessarily obtained evenly in every direction. Therefore, in the same manner as the method in the technique of Patent document 1 wherein measurement points suitable for obtaining the center coordinates of the true sphere are selected, it is necessary to examine a method of selecting measurement points suitable for obtaining the ellipsoidal sphere so as to strictly select measurement points enable to calculate precise offset values employing the measurement points obtained in the limited directions and to obtain the center point of the ellipsoidal sphere employing smaller number of the points and smaller calculation amount. However, none of the conventional applications has sufficient disclosure about it.

In the case where calculation is performed without selection of such measurement points, if the measurement points gather in a certain region on the azimuth sphere and are thinly distributed in other regions, only an ellipsoidal sphere remarkably depending on the data of the gathered measurement points can be obtained and it will become difficult to obtain the center point with high precision.

The present invention intends to newly provide a geomagnetic application device having a step of selecting a measurement point that enables to perform accurate offset correction even in the case that an azimuth sphere is an ellipsoidal sphere rather than a true sphere, and to perform offset correction with less azimuth errors even in the case that measurement points are selected in smaller numbers.

Means for Solving the Problems

The present invention relates to a geomagnetic application device that measures earth magnetism and utilizes the measured value of the earth magnetism, and provides a geomagnetic application device applying earth magnetism using a value of the earth magnetism determined by measurement, the device comprising:

a triaxial magnetic sensor orthogonally arranged to detect triaxial components of a geomagnetic vector which vary with movement of the geomagnetic application device or with postural change of the geomagnetic application device, as orthogonal triaxial component data;

a measurement point acquiring means for acquiring a predetermined number of geomagnetic vectors using the triaxial magnetic sensor and storing acquired data in a measurement point storage unit;

a calibration means for calibrating offset of the triaxial magnetic sensor; and an azimuth calculation means for calculating an azimuth which the geomagnetic application device faces, correcting the geomagnetic vectors based on a calibrated offset value obtained by the calibration means, which is characterized in that the calibration means is provided with an offset calculation measurement point selection means for selecting at least six measurement points of the geomagnetic vectors from among a data set stored in the measurement point storage unit by the measurement point acquiring means and storing the selected measurement points in an offset calculation measurement point storage unit, and an offset value calculation means for obtaining coordinates of a center point of an ellipsoidal sphere by solving an equation of an ellipsoidal sphere body based on the at least six measurement points stored in the offset calculation measurement point storage unit and for storing the obtained coordinates in a calibrated offset value storage unit, that the offset calculation measurement point selection means is configured to select the measurement points from among the data set stored in the measurement point storage unit so as to include at least six points, the component values of which are maximum or minimum in each of the three orthogonal axes, and that the offset value calculation means calculates parameters which define the ellipsoidal sphere as an azimuth sphere, based on the data of the selected measurement points.

Effects of the Invention

In the aforesaid geomagnetic application device, a plurality of magnetic vector values is detected by means of the triaxial magnetic sensor, utilizing direction change of the geomagnetic application device, which will be caused by movement of the user who takes along the device in his bag or pocket, utilizing direction change of the device, which will be caused during operation of the user who handles the device while watching the display, and in some cases, utilizing postural change of the device, which will be caused by the user's rotating operation which is purposely conducted, for example, in a manner to trace out a figure-of-8 once or several times as far as such operation will not excessively burden the user. Then, from among the plurality of the detected values, the measurement points are selected so as to include at least points (6 points in total), the component values of which are maximum or minimum in each of the three orthogonal axes. And then, the center point of an azimuth sphere is calculated with an ellipsoidal sphere equation using the selected 6 or more measurement points.

The geomagnetic application device in the present invention refers to every product that, as described in the title of the invention, measures earth magnetism and utilizes the measured value for any purpose. That is, as far as earth magnetism is utilized, irrespective of uses, it is indispensable to obtain an offset value and correct a detected geomagnetic vector in common. The applied product may specifically be, for example, an electronic compass which calculates an azimuth by using earth magnetism and displays it on a screen, a portable device such as a cellular phone which performs position navigation by using GPS information also, augmented reality (AR) which similarly identifies a current position and displays its information on the screen, a magnetic gyroscope which decides a change in posture of a geomagnetic application device based on earth magnetism to obtain a rotation axis, a rotation angle, and a rotation angular speed, or an air mouse.

The change in posture of the geomagnetic application device greatly varies with the process of a change in behavior of the user using it. To calculate the center point of the ellipsoidal sphere more accurately, it is ideal to obtain geomagnetic vectors in condition where the geomagnetic application device faces various directions in a three-dimensional space. However, if the obtained measurement points are used as they are, only the data in a certain specific direction may have been unevenly obtained in some cases. In such a case, even if the number of the data pieces of the measurement points themselves is large, it is difficult to accurately obtain the center point of the ellipsoidal sphere. To solve the problem, in the present invention, some of the measurement points are selected among the obtained data set in a manner to include at least two points (six points in total), the component values of which are maximum or minimum in each of the axes of the three-axis orthogonal coordinate system so as to enable accurately calculating the center point of an azimuth sphere using the minimum required number of measurement points.

That is, in the case where many measurement points are distributed in a certain region on an azimuth sphere, if a least-squares method is performed on the data of such measurement points input without selection, errors of the existing measurement points will be totalized and then minimized. In contrast, according to the method of the present invention, in the case where measurement points are concentrated in such a certain region, even if selection is conducted from the measurement points existing in the region only a single point is selected among these concentrated measurement points, and at least five points other than the one point are selected from any other areas. Therefore, even if the measurement points are unevenly distributed in a certain area, according to the present invention, the measurement points in the other areas are also selected similarly so that an offset can be securely calculated accurately.

MODE FOR CARRYING OUT THE INVENTION

Figure 1:
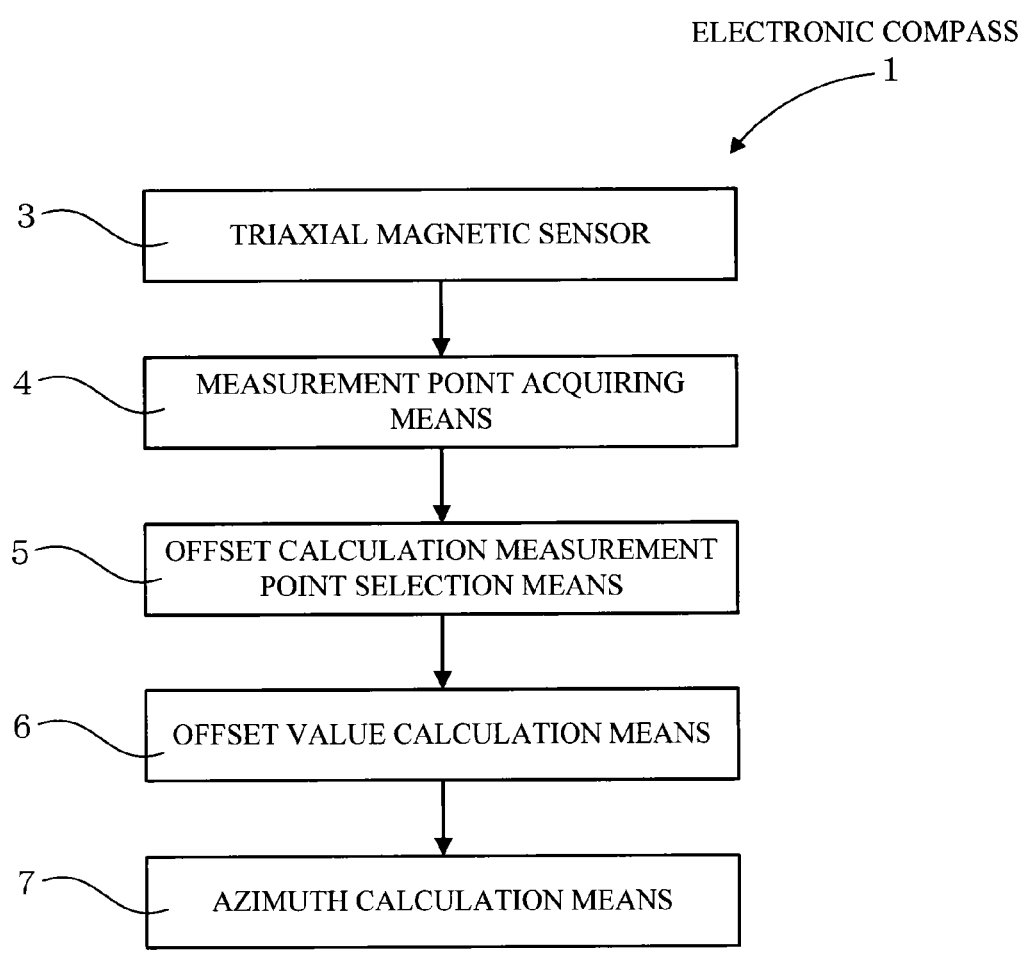
FIG. 1 is a conceptual diagram of a geomagnetic application device in First Embodiment.

A description will be given of preferred embodiments of the present invention described above.

It is preferable that the aforesaid offset calculation measurement point selection means selects arbitrary two axes among the three orthogonal axes to define two axes as virtual coordinate axes inclined by 30 to 60 degrees with respect to the two axes respectively, further selects points, the component values of which are maximum or minimum in each of the virtual coordinate axes and stores the selected points in the offset calculation measurement point storage unit, and calculates the parameters which define the ellipsoidal sphere as an azimuth sphere, based on the selected measurement points.

The center point of an ellipsoidal sphere can be calculated accurately by using measurement points in as many directions as possible. Consequently, according to claim 2, besides points selected in claim 1 at which the component values of each of three orthogonal axes are maximized and minimized, virtual coordinate axes inclined by 30 through 60 degrees with respect to two arbitrary ones of those three orthogonal axes are defined to additionally select points at which the component values of each of the two virtual coordinate axes are maximized and minimized from among those stored in a measurement point storage unit. As a result, a total of at least 10 measurement points (unless they overlap with the measurement points selected in claim 1) are used to obtain the center coordinate of the ellipsoidal sphere. Accordingly, accuracy can be further improved in calculations of the center coordinate of the ellipsoidal sphere.

The inclination angle of the arbitrarily selected two axes with respect to the three orthogonal axes is preferably 40 through 50 degrees and more preferably 45 degrees. Further, those selected two axes may be inclined to a direction in a plane including them or a direction inclined with respect to the plane. In either way, the same effects can be obtained in improving the calculation accuracy.

It is preferable that the aforesaid offset calculation measurement point selection means repeats a procedure of taking out the data of the measurement points one at a time from among the data set stored in the measurement point storage unit except for the measurement points selected by the offset calculation measurement point selection means recited in claim 1 or 2, and newly storing the measurement points taken out in the offset calculation measurement point storage unit only if the distance from the measurement point to all of the measurement points already selected and stored in the offset calculation measurement point storage unit are equal to or more than a predetermined value, as decreasing the predetermined value serving as a standard little by little, until a predetermined number of the points are stored.

To calculate the center coordinate more accurately, it is necessary to add measurement points to be found on an azimuth sphere in a direction that a sufficient number of measurement points has not yet been obtained to a data set consisting of the measurement points selected in claim 1 or in claims 1 and 2 for offset calculation, the axial components of which are maximum or minimum in each orthogonal axis. For this purpose, in claim 3, only the measurement points that meet a requirement that the distance from all of the measurement points which already have been selected from the measurement point storage unit and have been stored in the offset calculation measurement point storage unit should be equal to or more than a predetermined value are selected in addition to the measurement points already selected so as to obtain the center point coordinates of the ellipsoidal sphere by using all of the measurement points finally selected.

In the selection, the predetermined threshold value as a condition for the selection is defined first, and then measurement points yet to be selected are fetched from the measurement point storage unit one by one to calculate a distance from this measurement point to every measurement point already selected. Only if the calculated distance to every measurement point is equal to or more than the predetermined threshold value, the measurement point is newly stored in the offset calculation measurement point storage unit. This operation is repeated on all the measurement points yet to be selected as decreasing the predetermined threshold value little by little until the number of the selected measurement points reaches a predetermined value.

By performing the thus described measurement point selecting process, it is possible to securely select measurement points all over an azimuth sphere in all areas and in various directions evenly, although limited to the measurement points previously stored in the measurement point storage unit, so that it is possible to securely improve the center point calculation accuracy efficiently even in a smaller number of measurement points.

In addition, it is preferable that the aforesaid offset value calculation means calculates the parameters of the ellipsoidal sphere by using least-squares method based on the selected measurement points. Every measured geomagnetic vector has an error. To solve the problem, a plurality of selected measurement points is used to obtain parameters of an equation of an ellipsoidal sphere by using the least-squares method. As a result, effects can be provided such that the errors of the respective measurement points may offset each other, thereby obtaining the ellipsoidal sphere which is an accurate azimuth sphere.

Further, in the present invention, it is preferable to be characterized in that instructions to induce rotating operation are displayed on a screen of the geomagnetic application device, and then the measurement point acquiring means is performed during the rotating operation thus induced.

The user does not always use functions such as electronic compass functions which require geomagnetic vector measurement results when he is carrying around the geomagnetic application device. Even in a case where the user does not directly operate the geomagnetic application device, if the geomagnetic application device is, for example, a cellular phone, he cannot know when he gets a phone call or e-mail and, therefore, would carry it around in his bag or pocket ordinarily in condition where it is in the power-on state. Therefore, if the user changes his direction while moving, the direction of the geomagnetic application device such as the cellular phone also changes. When an e-mail arrives, he takes an action to take the geomagnetic application device out of the pocket, during this action the direction of the device changes further. Therefore, ordinarily, without forcing the user to perform operations purposely, a spontaneous change in posture of the geomagnetic application device can be used to obtain measurement points in various directions.

However, if he wants to use the functions of the application apparatus which require geomagnetic data before a sufficient number of measurement points have been obtained, for example, he wants to use the application apparatus functions which require geomagnetic vector values to be measured immediately after the power is turned on, some cases need the measurements points to be obtained quickly. Therefore, in such a case, an operator guidance screen requesting rotating operations can be displayed on the screen of the application apparatus such as a portable device to request him to perform the operations. In such a manner, the necessary data can be securely obtained in a short period of time.

Further, it is preferable that the geomagnetic vector is detected during operation of the measurement point acquiring means, for example, rotating operations conducted by the user as suggested in claim 5, and a difference is obtained in real time during acquisition between a maximum value and a minimum value of data of each axial component of the three orthogonal axes using the acquired measurement points and then an indication to the effect that the operation of the measurement point acquiring means has ended is displayed on the screen of the geomagnetic application device on condition that a predetermined number of the measurement points is obtained at a point where the measurement points, the difference of which exceeds a predetermined reference value for all of the three axes are obtained.

In rotating operations conducted by the user as recited in claim 5, the rotation direction varies depending on individual user, so that in some cases there is a possibility to raise a case that few measurement points may have been obtained in some directions on an ellipsoidal sphere, depending on his operating manner. Therefore, to check if a sufficient number of the measurement points are obtained to determine a center point of the ellipsoidal sphere, data is obtained during the rotation and a difference is obtained in real time between a maximum value and a minimum value of each axial component of the three orthogonal axes and compared to a predetermined reference value. If the data can be obtained in a manner such that the difference between the maximum and minimum values may be equal to or more than the predetermined threshold value for all of the axial components of the three orthogonal axes, it is possible to terminate the operation of measurement point acquiring means on condition that the measurement points in excess of a predetermined number have been obtained and to display on the screen of the geomagnetic application device an indication to the effect that the rotating operations are not necessary any more. It is thus possible to securely obtain measurement points required to accurately determine the center point of an ellipsoidal sphere when the user is performing rotating operations.

If the rotating operations by the user are not adequate enough to obtain measurement points that meet the standard, it is preferable to indicate instructions such as "Change your body direction and retry" or "Rotate the device and point in the different direction".

Not limited to the case that rotating operations are enforced as recited in claim 5, it is preferable to similarly check the data of the difference between the maximum and minimum values for all the axial components of the three orthogonal axes and it is of course possible to check if measurement points that meet the standard are obtained. In such a case also, if it is decided that a sufficient number of the measurement points are obtained, it is of course possible to display an indication to the effect that the operation of the measurement point acquiring means has ended, that by contraries a sufficient number of the measurement points are yet to be obtained, or that acquisition of the data is further to be continued.

It is preferable that when the geomagnetic vector is detected in sequence during operation of the measurement point acquiring means, a reference point serving as a standard is first acquired, and then an acquisition means is repeated for storing a point having a predetermined distance from the reference point in the measurement point storage unit only in a case where such point is acquired to define the point as an update reference point, and further storing a point having a predetermined distance from the updated reference point in the measurement point storage unit.

The recent geomagnetic sensors are capable of consecutively obtaining many measurement points in a short lapse of time. Accordingly, in the case where the geomagnetic application device is not changed in posture at all, even if geomagnetic vectors are measured consecutively, a plurality of points is merely obtained consecutively at almost the same position on an azimuth sphere. Even if many points obtained at almost the same position are stored, it does not contribute to an improvement in accuracy of offset value calculations at all. In obtaining measurement points and storing them in the measurement point storage unit, until a measurement point is obtained which is distant by at least a predetermined distance from the measurement point most recently stored in the measurement point storage unit, no measurement point is to be newly stored in the measurement point storage unit. If a measurement point which is distant to some extent is obtained, it is to be newly stored. In such a manner, by storing a smaller number of measurement points, it is possible to securely obtain measurement points required to accurately determine the center point of an ellipsoidal sphere. In the case of enforcing the user to perform rotating operations as in the case of claim 5, at a point where a predetermined number of the measurement points are stored, it is also possible to display an indication on the screen of the geomagnetic application device to the effect that the rotating operations are over and to notify that rotating operations are not necessary any more.

It is preferable that the azimuth calculation means obtains sensitivities of the triaxial magnetic sensor based on lengths of main axes obtained by solving the ellipsoidal sphere equation and calculates an azimuth which the geomagnetic application device faces based on a value of the geomagnetic vectors corrected on the basis of the obtained sensitivities.

To calculate an azimuth accurately, it is necessary to correct a three-axis orthogonal magnetic sensor so that the three axes have the same sensitivity, and then use the respective axial component values obtained after offset correction. As already described, the length of each main axis of the three orthogonal axes can be obtained by obtaining an equation of the ellipsoidal sphere using the selected measurement points. Therefore, an azimuth which the geomagnetic application device faces can be calculated using component values of the three orthogonal axes after their sensitivities are corrected based on the values of the lengths. Azimuth data thus obtained can be used not only in an electronic compass but also in various applications.

EMBODIMENTS

First Embodiment

The following will describe one embodiment of the present invention, in which the present invention is applied to an electronic compass built in a portable device.

The electronic compass according to the embodiment of the present invention will be explained with reference to FIGS. 1 to 8.

Figure 2:
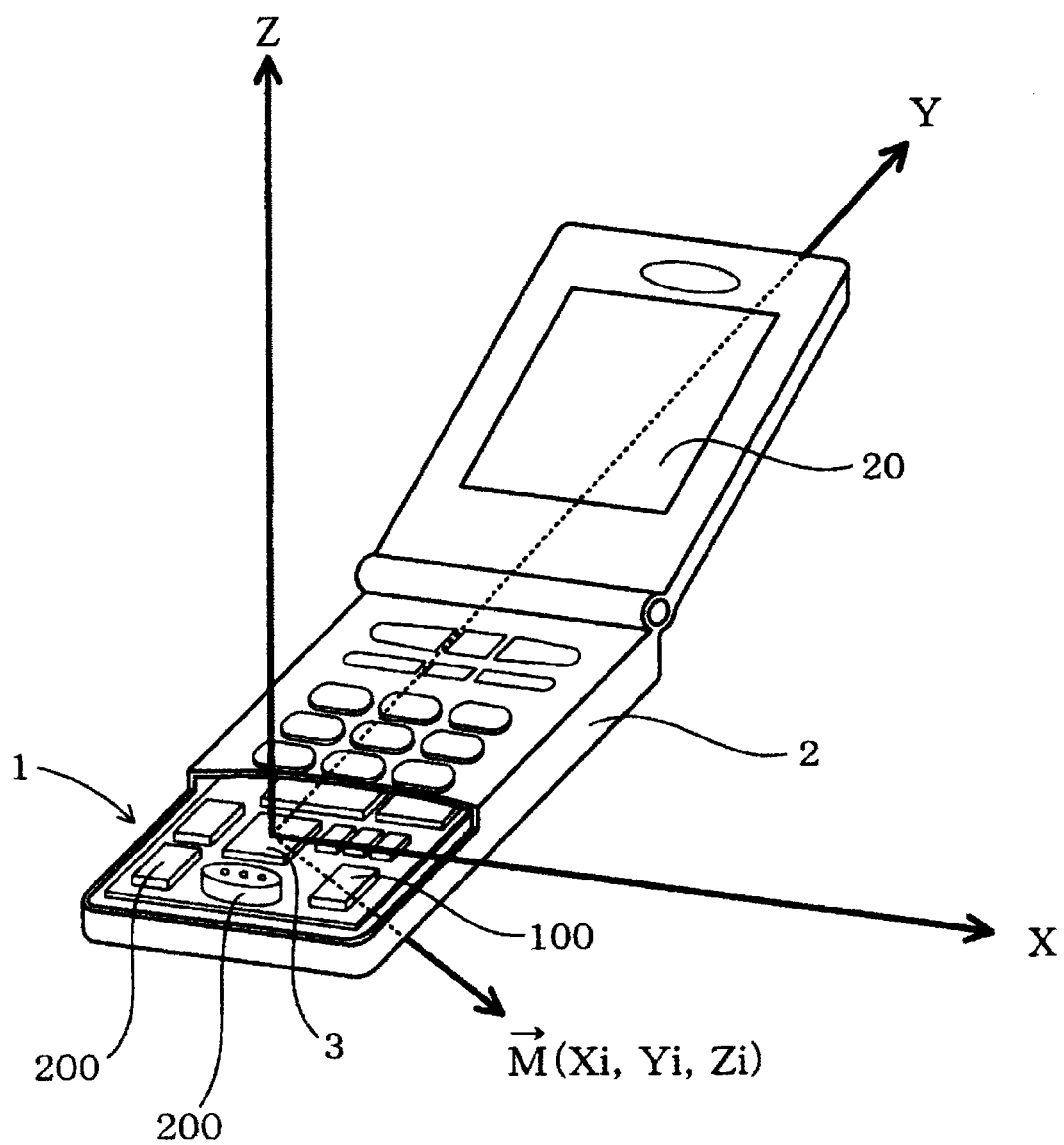
FIG. 2 is a partially transparent perspective view of a cellular phone having functions of an electronic compass in First Embodiment, which is an example of the geomagnetic application device.

As shown in FIG. 2, an electronic compass 1 of the present embodiment is mounted on a portable device 2. The electronic compass 1 calculates an azimuth which the portable device 2 faces while compensating for an influence from an internal magnetic field of the portable device 2.

As shown in FIG. 1, the electronic compass 1 includes a triaxial magnetic sensor 3, a measurement point acquiring means 4, an offset calculation measurement point selection means 5, an offset value calculation means 6, and an azimuth calculation means 7.

As shown in FIG. 2, the triaxial magnetic sensor 3 detects earth magnetism as a magnetic vector M in a three-axis orthogonal coordinate system which is fixed to the portable device 2.

The measurement point acquiring means 4 utilizes postural change of the portable device 2, which results from movement of the user carrying about the device 2 or is caused by the user's operation directly conducted in his hands, to obtain geomagnetic vector data in the various postures of this portable device 2 using the triaxial magnetic sensor 3. In this case, in order to obtain an accurate offset value by means of the offset value calculation means which will be explained later, in spite of acquisition of a smaller number of measurement points, it is preferable to obtain the measurement points while making an effective selection of the measurement points, for example, by storing in a measurement point storage unit 8 a measurement point present at a distance every time such measurement point has been obtained.

The offset measurement point selection means 5 selects only measurement points that satisfy predetermined conditions from among a data set stored in the measurement point storage unit 8 to select the measurement points that enable accurately calculating a center point of an ellipsoidal sphere and stores the data of geomagnetic vectors about those measurement points in an offset calculation measurement point storage unit 9.

The offset value calculation means 6 obtains coordinates of the center point by solving an equation of the ellipsoidal sphere using the data of the geomagnetic vectors stored in the offset calculation measurement point storage unit 9, to calculate an offset value, which is an influence of magnetic vectors other than the earth magnetism detected by the three-axis sensors.

The azimuth calculation means 7 calculates an azimuth which the geomagnetic application device faces by correcting the data of the geomagnetic vectors obtained with the triaxial magnetic sensor, based on the offset value obtained by the offset value calculation means 6 and a length of a main axis of the ellipsoidal sphere obtained by solving the ellipsoidal sphere equation, that is, a sensitivity specific to each axis of the triaxial magnetic sensor.

It will be described in detail as follows.

As shown in FIG. 2, the portable device 2 has the triaxial sensor 3 and a microcomputer 100 mounted thereon. In addition to them, a plurality of electronic components 200 is mounted. The electronic components 200 generate a magnetic field inside the portable device 2, by which the triaxial magnetic sensor 3 is affected.

The portable device 2 further includes a display unit 20. The display unit 20 indicates an azimuth which the geomagnetic application device faces, based on an azimuth calculated with the electronic compass of the present invention. The device 2 can also display a map of the surrounding area of the current position as adjusting the direction based on the calculated azimuth in a manner such that the upward direction of the display screen may be coincident with a traveling direction.

Figure 3:
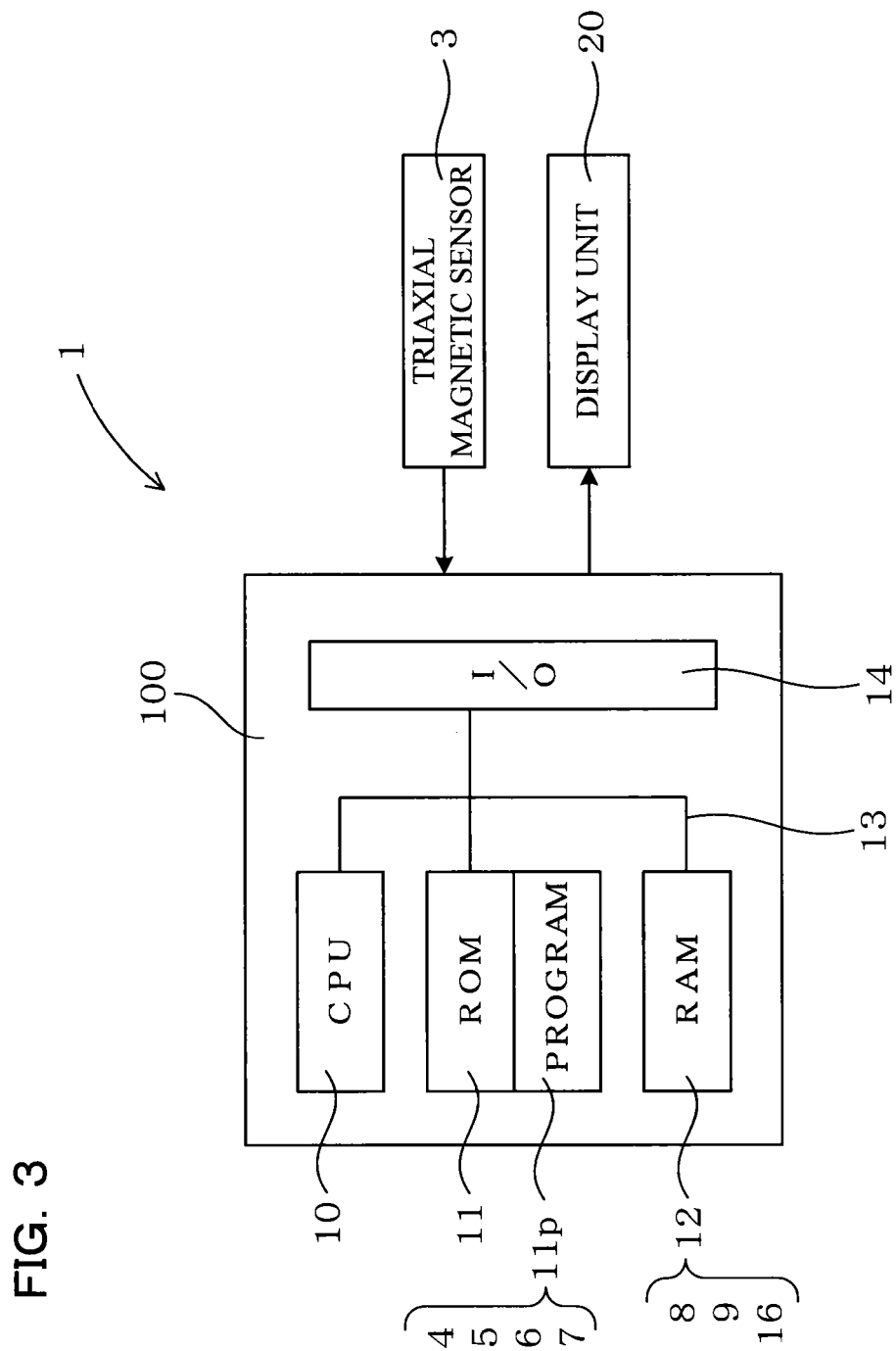
FIG. 3 is a block diagram of the electronic compass in First Embodiment, which is an example of the geomagnetic application device.

As shown in FIG. 3, the microcomputer 100 includes a CPU 10, an ROM 11, an RAM 12, an I/O 14, and a line 13 interconnecting them. The ROM 11 stores a program 11*p*. The RAM 12 has memory allocated, which is available to store obtained measurement point data or selected measurement points, and the measurement point storage unit 8, the offset calculation measurement point storage unit 9, and a yet-to-be-selected measurement point storage unit 16 are allocated as memory to store measurement points obtained as a result of executing the program 11*p*. In this configuration, when the CPU 10 reads the program 11*p* from the ROM 11 and executes it, the measurement point acquiring means 4, the offset calculation measurement point selection means 5, the offset value calculation means 6, and the azimuth calculation means 7 of the present embodiment will be operated.

Further, to the microcomputer 100, the triaxial magnetic sensor 3 and the display unit 20 are connected. The triaxial magnetic sensor 3 detects magnetic vectors, for example, every several milliseconds and transmits the detected values to the microcomputer 100.

Figure 8:
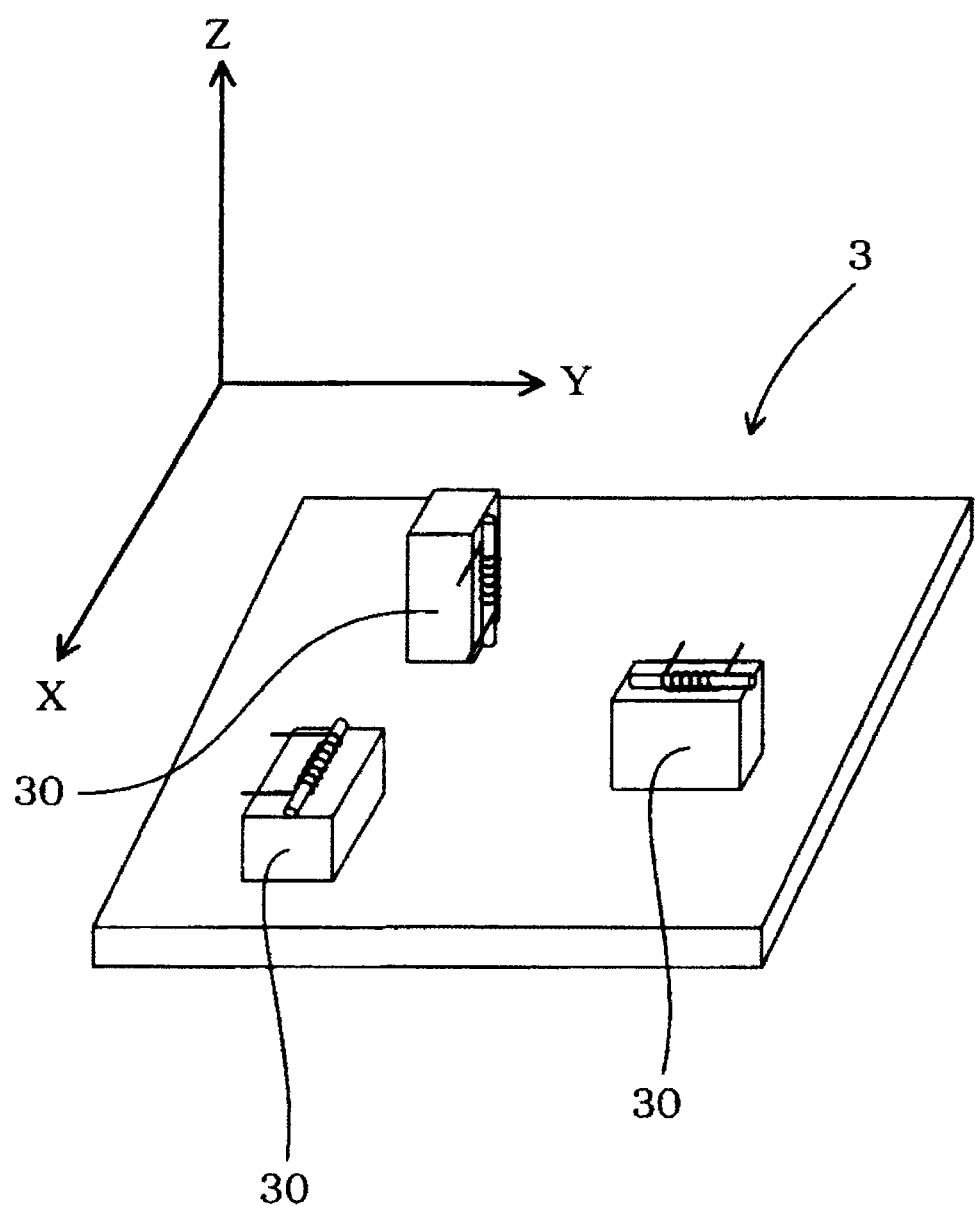
FIG. 8 is a perspective view of a triaxial magnetic sensor in the first embodiment.

As shown in FIG. 8, the triaxial magnetic sensor 3 includes magneto-impedance sensor elements 30. That is, the triaxial magnetic sensor 3 is formed by arranging the three magneto-impedance sensor elements 30 in a manner such that their magneto-sensitive directions are identical to mutually orthogonal three axis directions (X-axis, Y-axis, and Z-axis directions) respectively.

Figure 4:
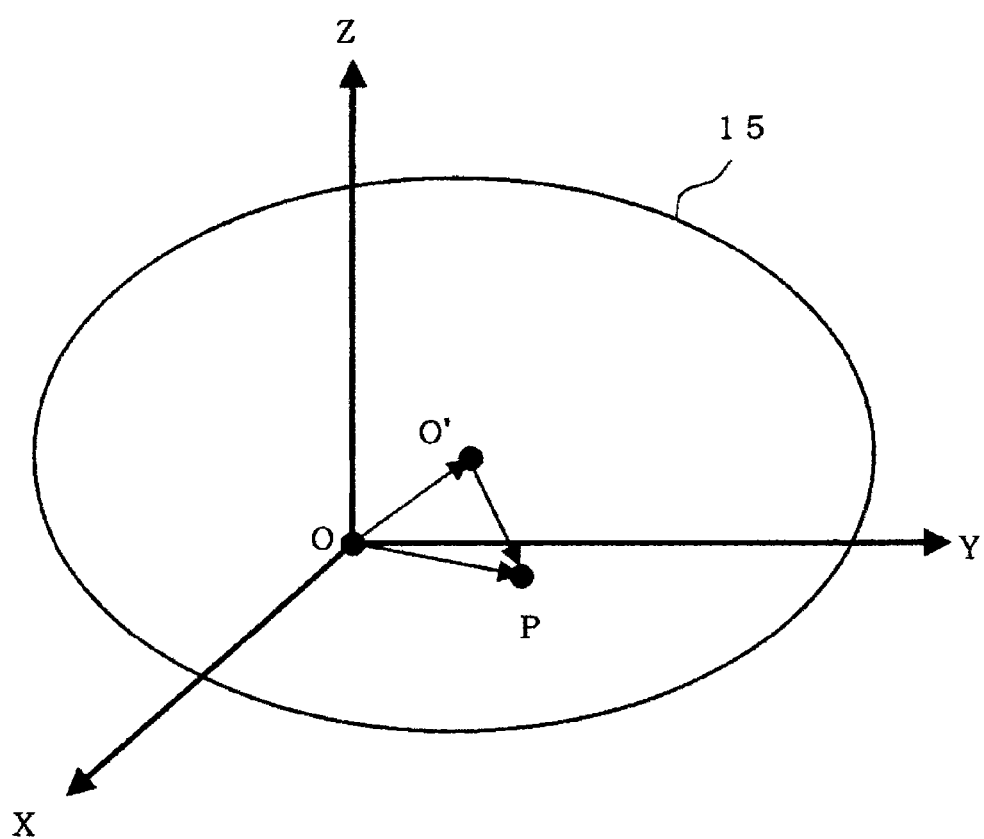
FIG. 4 is a view showing a detected magnetic vector value and positions of a center point before and after correction.

However, because the triaxial magnetic sensor 3 is affected by an internal magnetic field of the portable device 2, as shown in FIG. 4, a center point O' of an azimuth sphere 15 of the triaxial magnetic sensor 3 shifts from an origin O of the triaxial magnetic sensor 3 and, if there is a difference in sensitivity of each axis of the triaxial magnetic sensor owing to, for example, an effect from the magnetized soft magnetic components or manufacturing variations, the azimuth sphere will be ellipsoidal.

A vector OO' represents a displacement between the origin O of the three-axis orthogonal coordinate system and the center point O' of the azimuth sphere 15. If the center point O' of the azimuth sphere can be calculated correctly, a value (OP vector) detected by the triaxial magnetic sensor 3 subject to the internal magnetic field can be corrected using the following equation, to obtain a value (O'P vector) detected by the triaxial magnetic sensor 3 not subject to the internal magnetic field. As a result, it is possible to calculate an accurate azimuth which the geomagnetic application device faces.

$$\overrightarrow{O'P} = \overrightarrow{OP} - \overrightarrow{OO'} \quad \text{[Formula 1]}$$

To accurately calculate the center point O' of the azimuth sphere 15 which is ellipsoidal, it is ideal to obtain measurement points under the condition that the portable device 2 is turned evenly in every direction. However, this approach to actually force such operations on the user causes a problem for the user to shoulder a heavy burden. Consequently, the present invention employs a means that selects measurement points from among the obtained measurement points so as to enable to obtain the center point of an ellipsoidal sphere with highest accuracy in small number.

First, in the present invention, geomagnetic vector data in line for measurement points suitable for solving an equation of an ellipsoidal sphere is acquired, that is, the measurement point acquiring means 4 is performed. In the use of the portable device 2, the user does not always utilize the electronic compass functions, and there are also many cases in which enough time to acquire measurement points is secured until the electronic compass functions are utilized after turning on power. Therefore, in the meantime, the measurement points may be automatically obtained utilizing postural change of the portable device 2, which is caused by pointing the portable device 2 to various directions in a bag or a pocket or is caused during operation for e-mail or phone call; further, an indication to ask rotating operation of the user maybe displayed on the screen 20 of the portable device 2 in the case where the user needs the electronic compass functions in a phase that a sufficient number of offset calculation measurement points has not been obtained. In such a manner, the data of magnetic vectors in accordance with the various directions which the portable device faces, is acquired by the triaxial magnetic sensor 3 and stored in the measurement point storage unit 8.

The data will be acquired either when the user is conducting the operation of rotating the portable device 2 or when he is not doing so. Even if magnetic vectors are obtained consecutively in the condition that there is no change in posture of the portable device 2, it means that a plurality of measurement points having almost the same value can be acquired only. Therefore, after one data piece of a geomagnetic vector is stored in the measurement point storage unit 8, it is preferable to calculate a distance on an azimuth sphere between the most recently stored data and a newly acquired measurement point and, only if the distance is equal or more than a predetermined value, newly store the data of the geomagnetic vector in the measurement point storage unit 8. It is thus possible to efficiently utilize the memory allocated as the measurement point storage unit 8 and also reduce time required to select offset calculation measurement points as described later. Specifically, for example, if a point distant by at least 100 mG can be acquired, the point may be newly stored as a measurement point. This operation is repeated until the number of the measurement points stored in the measurement point storage unit reaches a predetermined quantity, at which time the measurement point acquiring means 4 is ceased. The predetermined number of the measurement points, which varies depending on required accuracy etc., may be set to 60, for example. Of course, it can be increased more to raise the offset accuracy.

However, depending on the way the user conducts the operations, the portable device 2 may be postured only in a specific direction in some cases. In such a case, the measurement points are also distributed only in a specific position on the azimuth sphere, so that the center point of the ellipsoidal sphere cannot be accurately obtained. Consequently, it is more preferable to calculate a maximum value and a minimum value of component values of each of the three orthogonal axes in real time and, if the values are less than a predetermined value, continue to store measurement points further or display on the screen 20 an indication to the effect that the accuracy might lower. Specifically, for example, the predetermined value can be set to 500 mG.

After necessary measurement points have been obtained by performing the measurement point storage means 4, offset calculation measurement points suitable for accurately obtaining the center point of the ellipsoidal sphere are subsequently selected from among the obtained measurement points.

Figure 5:
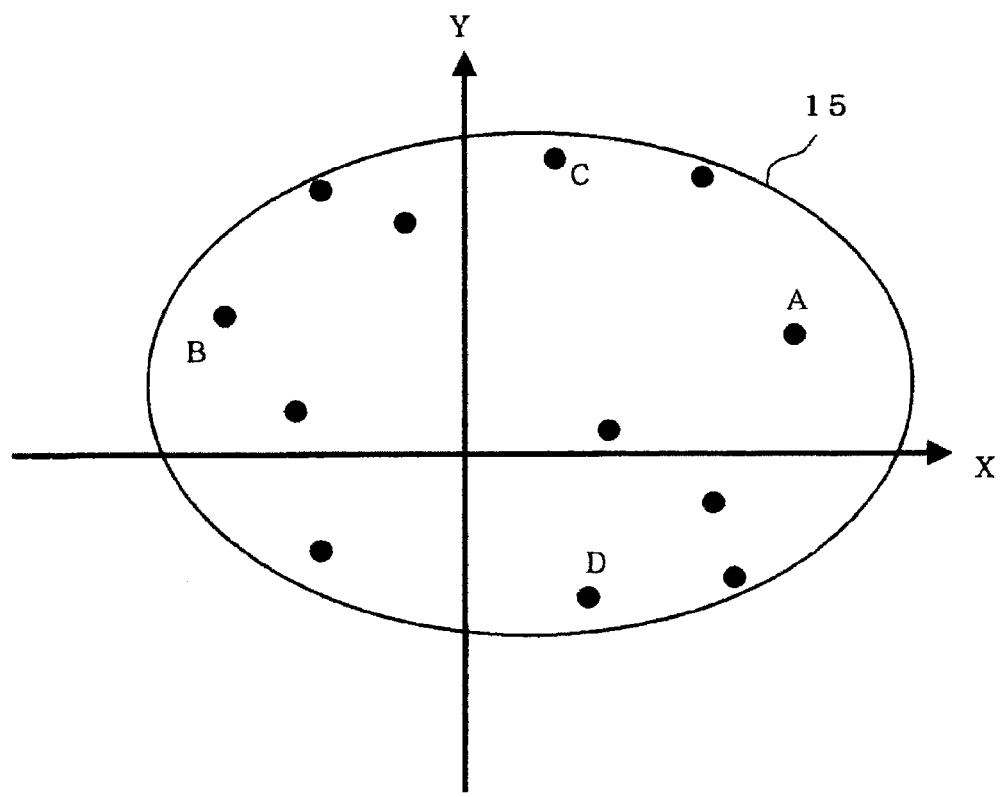
FIG. 5 is an explanatory view of a method of selecting points at which X-axis and Y-axis components are maximized and minimized.

First, the offset calculation measurement point selection means 5 selects points, the axial component values of which are maximum or minimum in each of the three orthogonal axes. FIG. 5 illustrates an example of distribution of the measurement points on the azimuth sphere viewed from a direction of the Z axis in the case where the Z axis is set to be orthogonal to the paper. As shown in this figure, the means 5 selects measurement points A and B the axial component values of which are respectively maximum and minimum in the X axis, and measurement points C and D the axial component values of which are respectively maximum and minimum in the Y axis and stores them in the offset calculation measurement point storage unit 9. Although no figure is shown, the means 5 similarly selects measurement points E and F the axial component values of which are respectively maximum and minimum in the Z axis and similarly stores them in the offset calculation measurement point storage unit 9. In this case, the selected measurement points should preferably be deleted from the measurement point storage unit 8 simultaneously with storage in the offset calculation measurement point storage unit 9. In such a manner, the six measurement points are selected.

In a method of solving an ellipsoidal sphere equation to be described later, the equation includes six unknowns. Therefore, the equation can be solved by six measurement points only. However, in the present embodiment, to improve accuracy in calculation of a center point, measurement points other than those six points will be selected using the following method.

Figure 6:
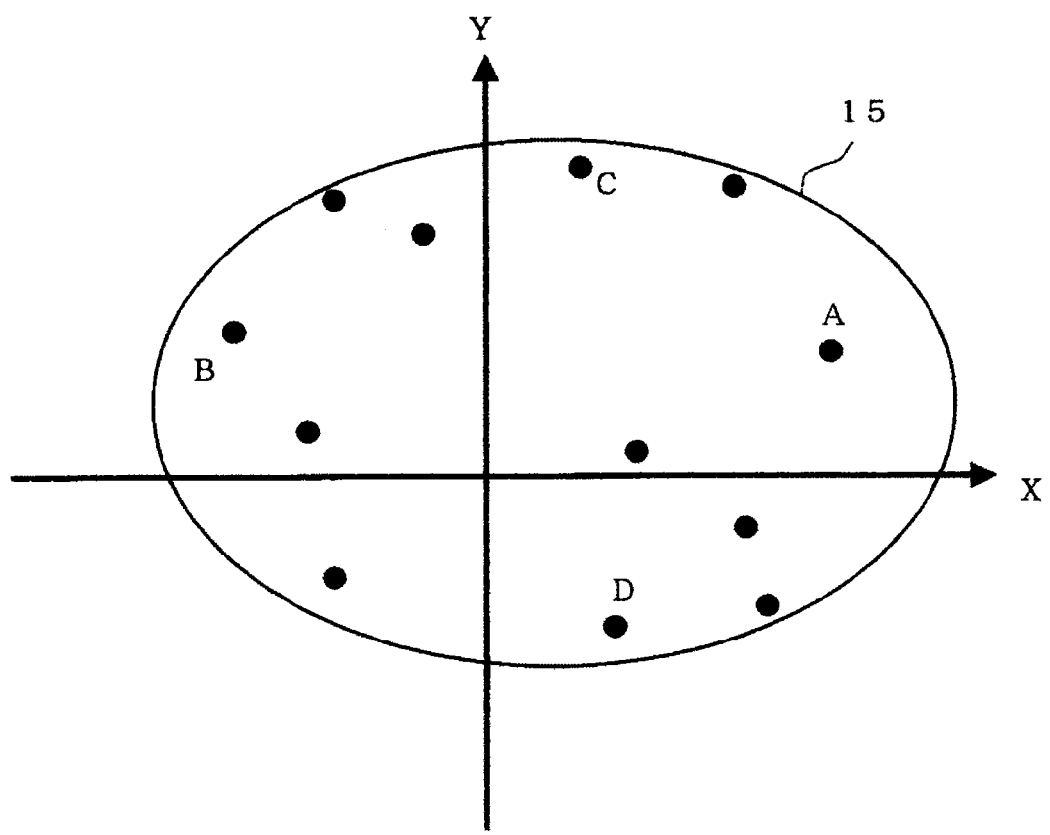
FIG. 6 is an explanatory view of a method of selecting points at which axial components of virtual axes inclined by 45 degrees with respect to the X-axis and Y-axis respectively are maximized and minimized.

As described above, six points, the axial component values of which are maximum or minimum in the three orthogonal axes of the magnetic sensor were selected. In addition, other orthogonal axes are virtually defined to select additional points, the axial component values of which are maximum or minimum in each of the other orthogonal axes. Specifically, as shown in FIG. 6, the X axis and Y axis as two axes of the three orthogonal axes are selected and inclined by 45 degrees to define resultant virtual orthogonal axes X' axis and Y' axis, and select points, the axial component values of which are maximum or minimum in the X' axis and Y' axis. In the case shown in FIG. 6, the component values in the X' axis are maximum and minimum at points G and H respectively, and the component values in the Y' axis are maximum and minimum at points I and J respectively. Those four points are stored in the offset calculation measurement point storage unit 9.

Although in this example, the X and Y axes were selected as two arbitrary axes, of course, any other two axes may be selected. Although the virtual axes were set by rotating the X and Y axes in a plane including the X and Y axes, of course the X and Y axes may be inclined in any other directions to define the virtual axes.

Although an inclination angle for setting the virtual axes is optimally 45 degrees, the angle may be selected in a range between 30 and 60 degrees. As a result of such selection, 10 measurement points for offset calculation can be selected.

Depending on the data measured first, some of the earlier selected six points may overlap with the newly selected four points in some cases. In such a case, the number of the measurement points selected hitherto may be 9 or less rather than 10, nevertheless, in the case where further measurement points will be subsequently selected as described later, the measurement points may be selected so that the selected measurement points finally reach a predetermined quantity.

Figure 7:
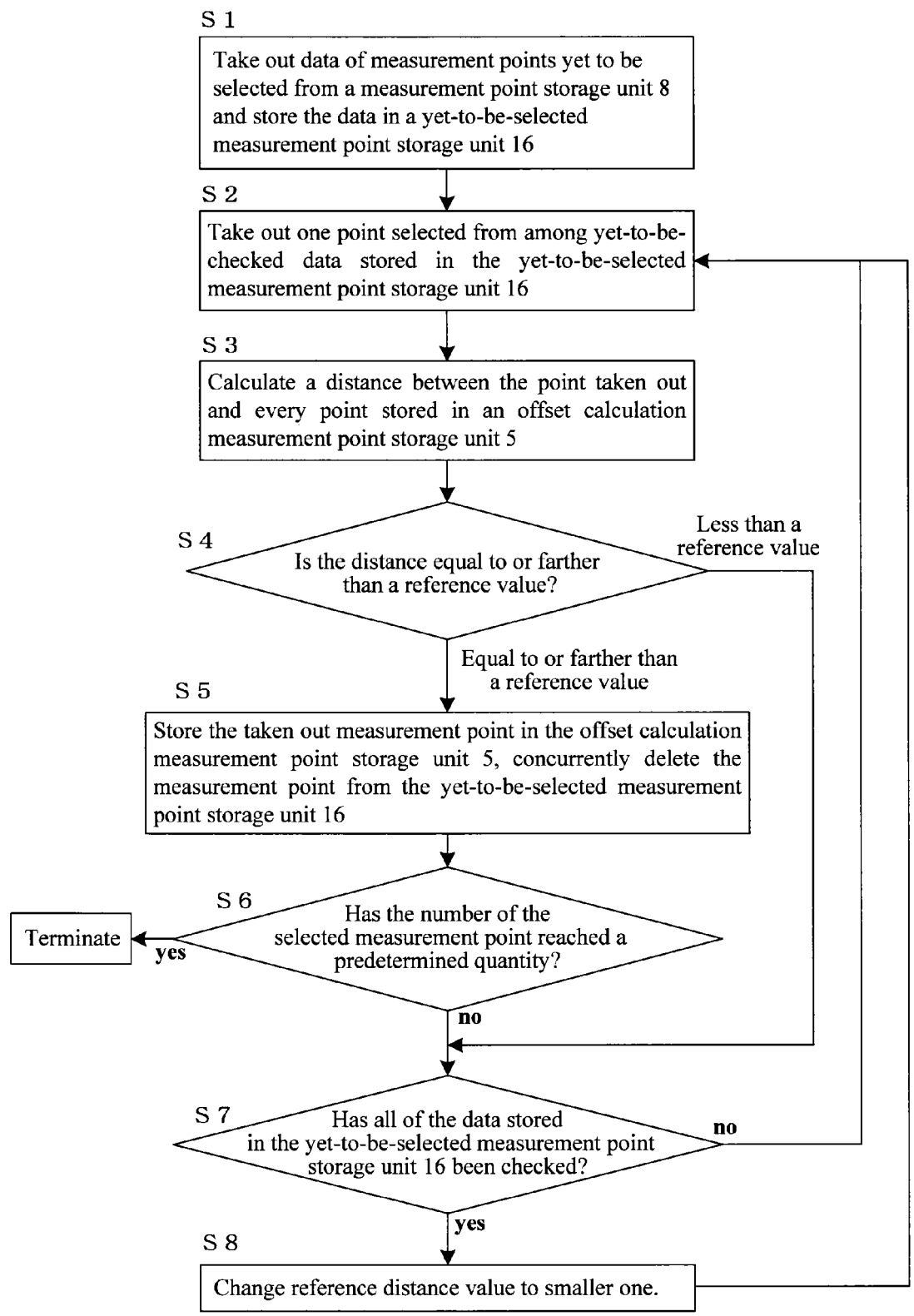
FIG. 7 is an explanatory flowchart of a procedure for selecting the 11th through 18th measurement points in the first embodiment.

Although it is possible to solve the ellipsoidal equation using the 10 measurement points selected in such a manner as explained above, the present embodiment would additionally select further measurement points by using a method shown in FIG. 7 in order to further improve the accuracy of center point calculation.

First, measurement points yet to be selected for offset calculation at a point where those 10 measurement points have been selected are stored in the yet-to-be-selected measurement point storage unit 16 (step S1). Then, data of arbitrary one point (except for any point that has undergone steps S3 and S4 with the same reference distance value) is taken out from the yet-to-be-selected measurement point storage unit 16 (step S2), to calculate a distance between this measurement point and every point already selected for offset calculation (step S3).

Then, the calculated distance from every selected measurement point is checked to see whether the distance is equal to or farther than the reference value (step S4). Only if every distance is equal to or farther than the reference value, the taken out measurement point is newly stored in the offset calculation measurement point storage unit 9, meanwhile, the data of which is deleted from the yet-to-be-selected measurement point storage unit 16 (step S5) and the number of the selected measurement point is checked to see whether the quantity has reached a predetermined quantity (step S6). If the number has reached the predetermined quantity, the processing is terminated and, otherwise, shifts to step S7. In the case where the distance from any one of the already selected measurement points is decided to be less than the reference value in step S4, the processing directly shifts to step S7. In step S7, it is determined if all of the data in the yet-to-be-selected measurement point storage unit has been checked under the currently set reference distance value. Where all the data has been checked, the reference distance value is changed to a smaller value (step S8) to return to step S2.

Otherwise, the processing returns to step S2 again without changing the reference distance value, to repeat the same steps.

By selecting measurement points according to the described procedure, it is possible to securely select the measurement points in condition where they are scattered to various positions on an azimuth sphere without being unevenly distributed in a specific area on it, of course, although limited to the range of the data first stored in the measurement point storage unit 8. Therefore, it is possible to securely select a combination of measurement points that enable determining an ellipsoidal center point most accurately from among the obtained measurement points.

Although a larger number of the finally selected measurement points improve the center point calculation accuracy, the number of points in excess of a certain value depresses the effects of improving the accuracy even if the points would be selected more, and besides, increases a calculation amount to prolong the processing. For this reason, the number of points should preferably be about 15 to 20 including the preceding 10 measurement points. In the present embodiment, the number of the selected points was set to 18.

The reference distance value is not limited to a specific value and can be set to, for example, 300 mG as the initial value and decreased by 25 mG at a time. By this data processing, it is possible to select measurement points that can be considered to be optimal for the purpose of offset calculation.

Next, a description will be given of a procedure for solving an equation of an ellipsoidal sphere by using selected offset calculation measurement points. The ellipsoidal sphere equation can be written as the following Equation 2.

$$\frac{(X - OffsetX)^2}{GainX^2} + \frac{(Y - OffsetY)^2}{GainY^2} + \frac{(Z - OffsetZ)^2}{GainZ^2} - 1 = 0 \quad \text{[Formula 2]}$$

In the present embodiment, this equation is solved by the least-squares method to obtain parameters of the ellipsoidal sphere as unknowns. This equation has six unknown parameters of OffsetX, OffsetY, and OffsetZ which are offset values on the respective orthogonal axes as well as GainX, GainY, and GainZ which correspond to the length (gain) of a main axis of the ellipsoidal sphere.

In the case of trying to obtain those parameters using the 18 measurement points, an ellipsoidal sphere including all of the measurement points cannot be obtained. Therefore, an ellipsoidal sphere in which deviations (errors) from the 18 measurement points is made minimized, is obtained by using the least-squares method. Then, squares of errors between the respective measurement points and an ellipsoidal sphere to be obtained are totalized to the resultant total to be e, which can be expressed by the following Equation 3 by using Equation 2.

$$e = \sum_{n=1}^{N} \left( \frac{(X_n - OffsetX)^2}{GainX^2} + \frac{(Y_n - OffsetY)^2}{GainY^2} + \frac{(Z_n - OffsetZ)^2}{GainZ^2} - 1 \right)^2 \quad \text{[Formula 3]}$$

To obtain parameter values that can minimize the value of Equation 3, Equation 3 is partially differentiated with respect to all of the six parameters respectively and a solution to it is defined to be 0. As a result, the following six simultaneous equations can be obtained (Equation 4).

$$\begin{cases} \dfrac{\partial e}{\partial GainX} = 0 \\ \dfrac{\partial e}{\partial GainY} = 0 \\ \dfrac{\partial e}{\partial GainZ} = 0 \\ \dfrac{\partial e}{\partial OffsetX} = 0 \\ \dfrac{\partial e}{\partial OffsetY} = 0 \\ \dfrac{\partial e}{\partial OffsetZ} = 0 \end{cases}$$ [Formula 4]

Since these equations are nonlinear simultaneous equations, it is possible to obtain the six parameters by performing convergent calculations based on a known method (dichotomy, Newton-Raphson method) configured to obtain solutions of nonlinear simultaneous equations.

Now that the offset values OffsetX, OffsetY, and OffsetZ of the three orthogonal axes are obtained, an azimuth is calculated using post-correction data (Xn', Yn', Zn') obtained by correcting pre-correction data (Xn, Yn, Zn) as indicated by Equation 5 based on the obtained offset values for magnetic vectors and the values of the main axis lengths corresponding to the sensitivities of the three-axis sensors.

$$\begin{cases} X'_n = \dfrac{X_n - OffsetX}{GainX} \\ Y'_n = \dfrac{Y_n - OffsetY}{GainY} \\ Z'_n = \dfrac{Z_n - OffsetZ}{GainZ} \end{cases}$$ [Formula 5]

However, if earth magnetism is reduced for any reason in an external environment at positions where offset calculation measurement points have been obtained, the obtained main axis length decreases correspondingly, so that there is a possibility that a trouble may occur when the distance is compared to the reference value in the steps described above. Therefore, it is preferable to store the output of an arbitrary axis sensor of the triaxial magnetic sensors in an environment where earth magnetism magnitude has been known beforehand to grasp the sensitivity of the reference magnetic sensor and correct the length of the main axis of the ellipsoidal sphere by using the value of this sensitivity. By performing correction in such a manner, it is made possible to select correct measurement points and calculate an azimuth irrespective of the state of earth magnetism at positions where offset calculation measurement points are obtained.

Next, a description will be given of effects of the present embodiment. The present embodiment first selects a total of 10 points by selecting the points, the axial component value of which are maximum or minimum in each of the three orthogonal axes from among the measurement points of earth magnetism vectors measured using the triaxial magnetic sensor and then selecting the points, the axial component values of which are maximum or minimum in each of a virtual orthogonal axes inclined by 45 degrees with respect to arbitrary two axes (X-axis and Y-axis in the present embodiment) among the three orthogonal axes a.

Then, the present embodiment selects eight more measurement points which are distant from all the other measurement points including those 10 points by a predetermined reference value, to select a total of 18 measurement points.

Thus, it is possible to securely select from among acquired measurement points those that are mutually distant on an azimuth sphere and are not unevenly distributed to a specific area. Therefore, it is possible to calculate an accurate offset value even with fewer measurement points selected.

The present technique can be utilized not only in an electronic compass described as one embodiment of the invention above but also in the case of detecting earth magnetism with magnetic sensor and calculating various physical values such as an azimuth based on results of the detection. That is, even when applying the present technique to any device other than the electronic compass, for example, an air mouse, if similarly detecting the direction of the mouse, this technique can be utilized to obtain an accurate offset value and then calculate the mouse direction accurately and perform operations on the computer screen in the air. Further, even in the case of determining an angular speed of rotation as in the case of a magnetic gyroscope, a rotation axis should be determined from accurate geomagnetic vectors to obtain an angular speed. Therefore, an offset value can be obtained accurately according to the technique of the present invention to calculate the rotation axis utilizing geomagnetic vectors corrected on the basis of the offset value so that obtain accurate rotation angle and angular speed of rotation can obtained. In this case, similar effects can be obtained by similarly selecting measurement points according to the technique similar to the present embodiment.

Further, measurement points to be selected are narrowed down to those that are optimal for accurate offset value calculation, and therefore more accurate calculation in a small amount of time is made possible differently from the case of acquiring many measurement points and directly calculating with the least squares without taking no account of the distribution of those points on an azimuth sphere. Further, it is possible to avoid a problem that accuracy degrades due to a strong influence of the values of many measurement points unevenly present in a specific area as in the case of offset calculation conducted using such measurement points. Therefore, the center point of an ellipsoidal sphere can be obtained in the most efficient manner.

Second Embodiment

In the first embodiment, the number of measurement points to be selected was set to 18; that is, points, the component value of which would be maximum or minimum in the three orthogonal axes and points, the component value of which would be maximum or minimum in the virtual axes, and then eight more measurement points have been selected in the steps shown in FIG. 7. The present embodiment is one example in which availability of offset correction performed by simple processing is regarded as more important than accuracy; that is, without selecting the eight measurement points to be selected in the steps shown in FIG. 7, 10 measurement points are used to obtain the center point of an ellipsoidal sphere in calculation of an azimuth. Methods for solving an equation of the ellipsoidal sphere and calculating the azimuth after the measurement points are selected are all the same as those in the first embodiment. The present embodiment has an advantage of quicker calculation than the first embodiment while being slightly worse in accuracy of an offset value.

Third Embodiment

The present embodiment, in an attempt to further shorten the calculation time more than the second embodiment, selects only six measurement points, the component values of which are maximum or minimum in three orthogonal axes and calculates an offset value. By substituting the six measurement points into the equation (Equation 1) of an ellipsoidal sphere, six equations can be obtained, so that rather than using the least-squares method, the equation into which values of the measurement points are substituted can be solved as it is to obtain six unknowns.

Although the present embodiment is less accurate in calculation of an offset value and a main axis length than the first and second embodiments, it may be improbable that the six points for use in calculation, although selected in small numbers, are unevenly distributed on the azimuth sphere, from a viewpoint of its selecting method. Therefore, the method of the present embodiment is considered to be an optimal selection method as a method for solving an equation by using only the six points. In addition, although this embodiment is somewhat inferior to the first embodiment and such in the calculation accuracy, since only the six points are used in calculation, an advantage of reduction in electrical requirement can be obtained in addition to an effect of shortening of processing time owing to greatly mitigated calculation burdens.

Also in the second and third embodiments, the invention can be applied to other use than an electronic compass just the same as in the case of the first embodiment described above. An optimal method selected from among the first through third embodiments depends on requirements such as calculation accuracy required in each case or need for rapid azimuth calculation even at the expense of accuracy to some extent. Therefore, even the same geomagnetic application device should preferably be used while selecting an optimal method for calculation of an azimuth etc. in each case.

The invention claimed is:

1. A geomagnetic application device applying earth magnetism using a value of the earth magnetism determined by measurement, the device comprising:
a triaxial magnetic sensor orthogonally arranged to detect triaxial components of a geomagnetic vector which vary with movement of the geomagnetic application device or with postural change of the geomagnetic application device, as orthogonal triaxial component data;
a measurement point acquiring means for acquiring a predetermined number of geomagnetic vectors using the triaxial magnetic sensor and storing acquired data in a measurement point storage unit;
a calibration means for calibrating offset of the triaxial magnetic sensor; and
an azimuth calculation means for calculating an azimuth which the geomagnetic application device faces, correcting the geomagnetic vectors based on a calibrated offset value obtained by the calibration means,
wherein the calibration means is provided with an offset calculation measurement point selection means for selecting at least six measurement points of the geomagnetic vectors from among a data set stored in the measurement point storage unit by the measurement point acquiring means and storing the selected measurement points in an offset calculation measurement point storage unit, and an offset value calculation means for obtaining coordinates of a center point of an ellipsoidal sphere by solving an equation of an ellipsoidal sphere body based on the at least six measurement points stored in the offset calculation measurement point storage unit and for storing the obtained coordinates in a calibrated offset value storage unit,
the offset calculation measurement point selection means is configured to select the measurement points from among the data set stored in the measurement point storage unit so as to include at least six points, the component values of which are maximum or minimum in each of the three orthogonal axes, and
the offset value calculation means calculates parameters which define the ellipsoidal sphere as an azimuth sphere, based on the data of the selected measurement points.

2. The geomagnetic application device according to claim 1,
wherein the offset calculation measurement point selection means selects arbitrary two axes among the three orthogonal axes to define virtual coordinate axes inclined by 30 to 60 degrees with respect to the two axes respectively, further selects points, the component values of which are maximum or minimum in each of the virtual coordinate axes and stores the selected points in the offset calculation measurement point storage unit, and calculates the parameters which define the ellipsoidal sphere as an azimuth sphere, based on the selected measurement points.

3. The geomagnetic application device according to claim 1 or 2,
wherein the offset calculation measurement point selection means repeats a procedure of taking out the data of the measurement points one at a time from among the data set stored in the measurement point storage unit except for the measurement points previously selected by the offset calculation measurement point selection means and newly storing the measurement points taken out in the offset calculation measurement point storage unit only if the distance from the measurement point to all of the measurement points already selected and stored in the offset calculation measurement point storage unit are equal to or more than a predetermined value, as decreasing the predetermined value serving as a standard little by little, until a predetermined number of the points are stored.

4. The geomagnetic application device according to claim 1 or 2,
wherein the offset value calculation means calculates the parameters of the ellipsoidal sphere by using least-squares method based on the selected measurement points.

5. The geomagnetic application device according to claim 1 or 2,
wherein instructions to induce rotating operation are displayed on a screen of the geomagnetic application device, and then the measurement point acquiring means is performed during the rotating operation thus induced.

6. The geomagnetic application device according to claim 1 or 2,
wherein the geomagnetic vector is detected during operation of the measurement point acquiring means and a difference is obtained in real time during acquisition between a maximum value and a minimum value of data of each axial component of the three orthogonal axes using the acquired measurement points and then an indication to the effect that the operation of the measurement point acquiring means has ended is displayed on the screen of the geomagnetic application device on condition that a predetermined number of the measurement points is obtained at a point where the difference exceeds a predetermined reference value for all of the three axes.

7. The geomagnetic application device according to claim 1 or 2,
wherein when the geomagnetic vector is detected in sequence during operation of the measurement point acquiring means, a reference point serving as a standard is first acquired, and then an acquisition means is repeated for storing a point having a predetermined distance from the reference point in the measurement point storage unit only in a case where such point is acquired to define the point as an update reference point, and further storing a point having a predetermined distance from the updated reference point in the measurement point storage unit.

8. The geomagnetic application device according to claim 1 or 2,
wherein the azimuth calculation means obtains sensitivities of the triaxial magnetic sensor based on lengths of main axes obtained by solving the ellipsoidal sphere equation and calculates an azimuth which the geomagnetic application device faces based on a value of the geomagnetic vectors corrected on the basis of the obtained sensitivities.

* * * * *

UNITED STATES PATENT AND TRADEMARK OFFICE
CERTIFICATE OF CORRECTION

PATENT NO. : 8,698,503 B2  
APPLICATION NO. : 13/983308  
DATED : April 15, 2014  
INVENTOR(S) : Yoshinobu Honkura et al.

Page 1 of 1

It is certified that error appears in the above-identified patent and that said Letters Patent is hereby corrected as shown below:

In the drawings, Sheet 6, Fig. 6, the figure should not be a duplicate of Fig. 5, but instead reflect Fig. 6 as below:

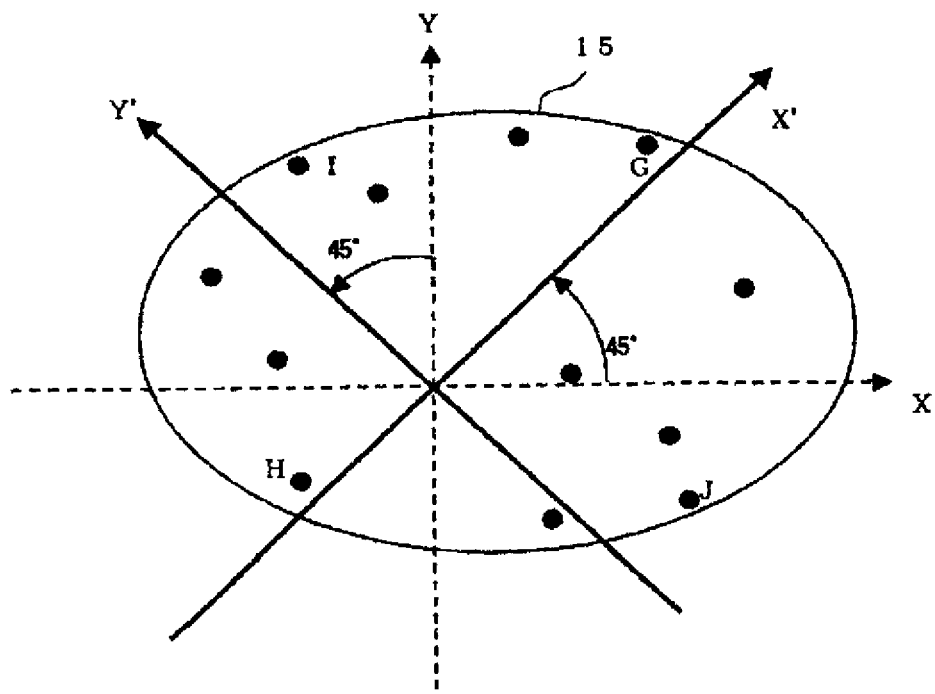

Signed and Sealed this  
Ninth Day of September, 2014

Michelle K. Lee  
*Deputy Director of the United States Patent and Trademark Office*